United States Patent
Belanger, Jr. et al.

(10) Patent No.: US 6,734,776 B2
(45) Date of Patent: May 11, 2004

(54) FLEX CIRCUIT RELAY

(75) Inventors: Thomas Dudley Belanger, Jr., Saline, MI (US); David John Rutkowski, Grosse Ile, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 26 days.

(21) Appl. No.: 10/063,024

(22) Filed: Mar. 13, 2002

(65) Prior Publication Data
US 2003/0174038 A1 Sep. 18, 2003

(51) Int. Cl.$^7$ ................................................. H01F 5/00
(52) U.S. Cl. ........................................ 336/200; 336/232
(58) Field of Search ................................ 336/200, 223, 336/232; 257/E23.065, E26.067, E23.177; 174/254

(56) References Cited

U.S. PATENT DOCUMENTS

| | | | |
|---|---|---|---|
| 4,093,883 A | 6/1978 | Yamamoto | 310/317 |
| 4,403,166 A | 9/1983 | Tanaka et al. | 310/332 |
| 4,445,732 A | 5/1984 | Wafer | 439/38 |
| 4,564,832 A | 1/1986 | Inoue | 340/365 R |
| 5,121,091 A | 6/1992 | Fujiyama | 335/1 |
| 5,156,553 A | 10/1992 | Katsumata et al. | 439/62 |
| 5,161,985 A | 11/1992 | Ramsey | 439/284 |
| 5,206,463 A * | 4/1993 | DeMaso et al. | 174/254 |
| 5,501,009 A | 3/1996 | McClure | 29/882 |
| 5,727,956 A | 3/1998 | Mitra et al. | 439/74 |
| 5,921,787 A | 7/1999 | Pope | 439/660 |
| 6,044,708 A * | 4/2000 | Hirosawa | 73/504.15 |
| 6,329,610 B1 * | 12/2001 | Takubo et al. | 174/264 |
| 6,333,468 B1 * | 12/2001 | Endoh et al. | 174/256 |
| 6,486,409 B1 * | 11/2002 | Sako | 174/254 |
| 6,501,528 B1 * | 12/2002 | Hamada | 349/158 |
| 6,606,083 B1 * | 8/2003 | Murray et al. | 345/158 |

OTHER PUBLICATIONS

Face International Corporation, http://www.face-int.com/thunder/tech/content/tcont2a.htm Pages from website on the subject of Thin Layer Composite Unimorph Ferroelectric Driver and Sensor (THUNDER) Technology, no date.

* cited by examiner

Primary Examiner—Anh Mai
(74) Attorney, Agent, or Firm—Jennifer M. Stec

(57) ABSTRACT

An arrangement of a flex circuit relay (7) is provided which in a preferred embodiment has a first substrate (16) and a second substrate (40). The substrates (16), (40) have conductive membranes (17), (50) connected thereto. The second substrate (40) has a contact portion (44). Adjacent to contact portion (44) is a ferritic member (48). A coil (22) is provided having wire windings wrapped around a core. The coil (22) provides a magnetic field to cause the second substrate (40) to move between a first position spaced away from the first substrate (16) and a second position spaced adjacent to the first substrate (16) against a flexural force of the second substrate (40).

18 Claims, 3 Drawing Sheets

FLEX CIRCUIT RELAY

BACKGROUND OF INVENTION

The present invention relates to flexible circuits and more particularly to flexible circuits utilized in the automotive industry which can additionally incorporate relays for circuits.

In the most recent quarter century the utilization of electronics in automotive vehicles has increased significantly. For example, virtually all automotive vehicles have an engine control module to optimize the performance of the engine with regard to fuel efficiency and environmental emissions. Inflatable restraints have been added to enhance occupant safety in a crash situation. Advanced braking systems, such as anti-skid braking and traction control further enhance safe operation of the vehicle. Other electrical systems have been added or enhanced to increase the comfort of the vehicle.

The above mentioned additions and enhancements have resulted in a more complex wiring system which supplies power and signal transfer to and from various electrical components and controllers. Currently, much of the power and signaling requirements of a vehicle are supplied by hard conductive wiring, which is housed in a wiring harness. Fabrication of a wiring harness is a very labor-intensive operation. Installation and/or repair of a wiring harness can also be very time consuming and expensive.

Another disadvantage associated with the hard copper conductive wiring is the cost associated with the copper. For certain applications, the copper wire needed for signal transfer at a low electrical load can be a copper wire of a very small cross-sectional area. However, a minimum diameter of copper wiring is not determined by its electrical requirements. The minimum diameter of the wiring is determined by its frailty during the assembly process of the wiring harness and of the wiring of the vehicle.

To reduce the cost of automotive wiring harnesses a new type of electrical conduit has been provided. This new conduit is typically referred to as a flexible circuit. In a flexible circuit, a polymeric (or insulated metallic ribbon) substrate which is flexible, provides support for the various electrical conductor lines. The electrical conductors are then supplied by a foil that is affixed to the flexible substrate. Another flexible layer of polymeric material can cover the conductors on the flexible substrate.

Utilizing flexible circuits as a replacement for the prior wiring harnesses has been limited due to the particular problems faced by flexible circuits at the various component interfaces. For instance, the interface of the flexible circuit with a fuse box has been a particular limiting factor. To overcome those limitations, an inventive contact method has been provided in U.S. patent application Ser. No. 09/298, 240 filed Apr. 22, 1999. Other examples of connector interfaces for flexible circuits can be found in U.S. Pat. Nos. 5,885,091 and 5,969,418.

Another problem with utilizing flexible circuits is in the use of relays. Relays typically are switches that have two contacts which are spring biased toward or away from each other, and are activated (closed or opened) by an electromagnetic force by a selectively excitable electromagnetic coil. Relays are typically provided for high current applications that require momentary application.

SUMMARY OF INVENTION

A preferred embodiment arrangement of a relay that utilizes a flex circuit is provided. The relay arrangement has a first substrate that may be a flex circuit or a conventional rigid circuit board. A first conductive membrane is connected on the first substrate. A second substrate which is flexible is provided. The second flexible substrate has a contact portion. In a first position, the second substrate contact portion is spaced away from the first substrate. In a second position, the second substrate contact portion is spaced adjacent to the first substrate.

A second conductive membrane is connected on the second substrate. A ferritic member is also connected on the second substrate. The ferritic member is adjacent to the contact portion.

A coil is provided. The coil has wire windings wrapped around a core for providing a magnetic field. The magnetic field causes the second substrate contact portion to move between the first and second positions against a flexural force of the second substrate.

It is an advantage of the present invention to provide an arrangement of a flex circuit relay.

Other features and advantages of various embodiments of the present invention will become more apparent to those skilled in the art from a reading of the following detailed description and upon reference to the drawings.

DETAILED DESCRIPTION

Figure 1:
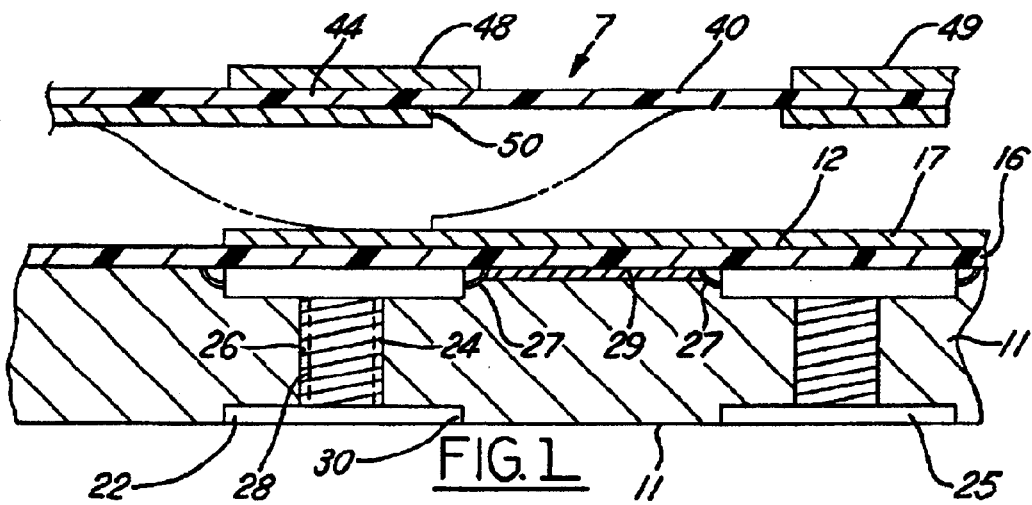
FIG. 1 is a sectional view of a preferred embodiment flex circuit relay of the present invention with the height of certain components exaggerated for purposes of illustration.

An arrangement of a relay 7 of the present invention is shown in FIG. 1. (The height of various components in all figures is shown exaggerated for purposes of illustration.) The relay includes a first substrate 16 that will typically be a non-flexible rigid PWB material such as FR4. Other suitable electronic non ferrous materials, such as ceramic can also be utilized. Furthermore, the substrate 16 can be a non ferrous metal ribbon that is insulated by a post-lamination process, or by use of an adhesive which bonds a conductor to the substrate. If a metal ribbon substrate is provided, it can be utilized as part of an electrical circuit as a ground plane.

Connected on the first substrate 16 along a top surface 12 is a first conductive membrane 17. The first conductive membrane typically can be foil copper which has been etched out in a circuit desired pattern. The first conductive membrane 17 can also be adhesively connected to the first substrate 16. Other conductive membrane materials can include an unsolderable material such as aluminum or aluminum alloy which is clad over with copper. The conductive membrane can also be clad over with an 0.0008 inch layer of silver. The copper or silver allows an electrical component to be attached to the conductive membrane by solder, although aluminum is being relied upon to perform the conductive function. Additionally the cladding reduces interface resistance.

The first conductive membrane 17 has a gap 20 therein. The gap 20 is desired to present shorts between the termination points of electrical components.

Adjacent to the first substrate 16 is a coil support structure 11. The coil support structure 11 is typically provided by a generally rigid polymeric material such as plastic. A coil 22 is embedded within the coil support structure 11. A plurality of coils as shown can be arranged in arrays to provide multiple switching assemblies. The coils have terminations 27 connected to an interface 29 on conductive membrane 17 to provide an electrical completion to the next assembly.

The coil 22 includes wire 24 windings 26. The wires 24 may be wrapped around a ferritic core 28. The ends of the core 28 are fixed with polymeric spool ends 30.

The relay arrangement 7 also has a second coil 25 which is similar to coil 22. Coil 25 can be designed to be actuated independently of coil 22 and a gap can be provided in the conductive membrane 17 to provide an independent circuit connection. Coil 25 can be activated to attract ferritic member 49. Although an array of two coils is shown, the array may have a 10×10 array or larger number to provide a multitude of independent or dependent relay circuits as desired.

Still referring to FIG. 1, the invention also provides a second substrate 40, fabricated from a flexible polymeric material, typically approximately 0.75 mm thick. Preferred values have been found between a range of 0.25 and 1.5 mm. However, the present invention can utilize flexible substrates with a thickness lower or greater than the aforementioned range.

A preferred material for the second substrate 40 is polyamide. Polyamide is often preferable for soldering electrical devices to the second substrate 40. However, when a conductive adhesive is utilized to connect electrical devices to the second substrate 40 in lieu of soldering, polyester has been found to be suitable.

The second substrate 40 can also include other material such as PVDF and Teflon. Furthermore, the second substrate 40 can be a non-ferrous metal foil ribbon which is insulated by a post-lamination process, or by an adhesive which is used to bond a conductive membrane to the second substrate. However, when metal is utilized it must be thin enough to ensure the proper flexible properties.

Connected to the second substrate 40 is a contact portion 44 and a conductive membrane 50. Adjacent to the contact portion 44 is ferritic member 48. The conductive membrane 50 may be similar to the conductive membrane 17 having an aluminum underbase and a copper clad cover or it may simply be a copper or a copper alloy and/or silver membrane.

The second substrate 40 has a first position (shown in solid line) spaced away from the first substrate 16. Excitation of the coil 22 causes a magnetic field to be generated which interacts with the ferritic member 48. The ferritic member 48 is attracted downward and the second substrate 40 is moved to a second position adjacent to the first substrate (shown in phantom). Termination of the current flow in the coil 22 allows for termination of the magnetic field and for the second substrate 40 to return to its upper position.

Figure 2:
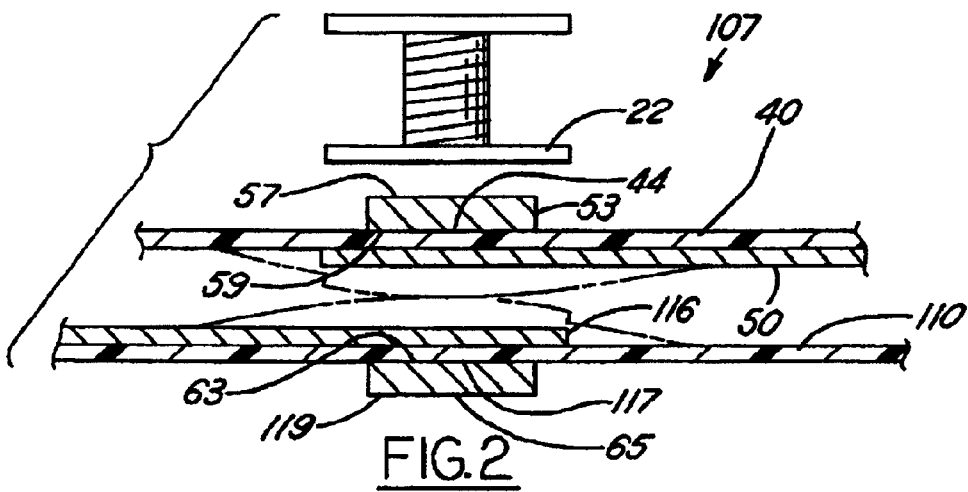
FIG. 2 is a height-exaggerated sectional view of an alternate preferred embodiment of the present invention wherein the first and second substrates are both flexible.

Referring now to FIG. 2, a relay 107 is provided with items performing similar functions being given identical reference numerals. Relay 107 has a coil 22 similar to that previously described. Relay 107 has a second substrate 40 with a second conductive membrane 50. The second substrate 40 has a contact portion 44 as previously described, along with a permanent magnet ferritic member 53. The magnet 53 has upper and lower ends 57, 59.

Relay 107 has a first substrate 110 which is flexible and similar or identical to the second substrate 40. The first substrate 110 also has connected thereto a first conductive membrane 116. The first substrate 110 has a contact portion 117. Adjacent to the contact portion 117 is a permanent magnet ferritic member 119. The permanent magnet 119 has upper and lower ends 63, 65.

Both the second substrate 40 and the first substrate 110 have a first position generally spaced away from one another. The substrates 40, 110 have a second position contacting one another upon activation of the coil 22.

The functioning of the relay 107 is dependent upon the polarity of the ends of the permanent magnets 53, 119. If the lower end 59 of permanent magnet 53 has the same polarity as the adjacent upper end 63 of the permanent magnet 119, then activation of the coil 22 will cause a magnetic field which will overcome the natural magnetic resistance between the permanent magnets 53, 119. This will cause the first and second substrates 110, 40 to close towards one another (shown by the phantom line).

The relay 107 can also be configured such that the lower end 59 and the adjacent upper end 63 of the permanent magnets may have opposite polarities. If opposite polarities exist, the first substrate 110 and second substrate 40 will normally be contacting one another (shown in phantom). Activation of coil 22 will create a magnetic field that will pull the second substrate 40 away from the first substrate 110 to open the circuit that exists between the conductive membranes 116, 50.

Figure 3:
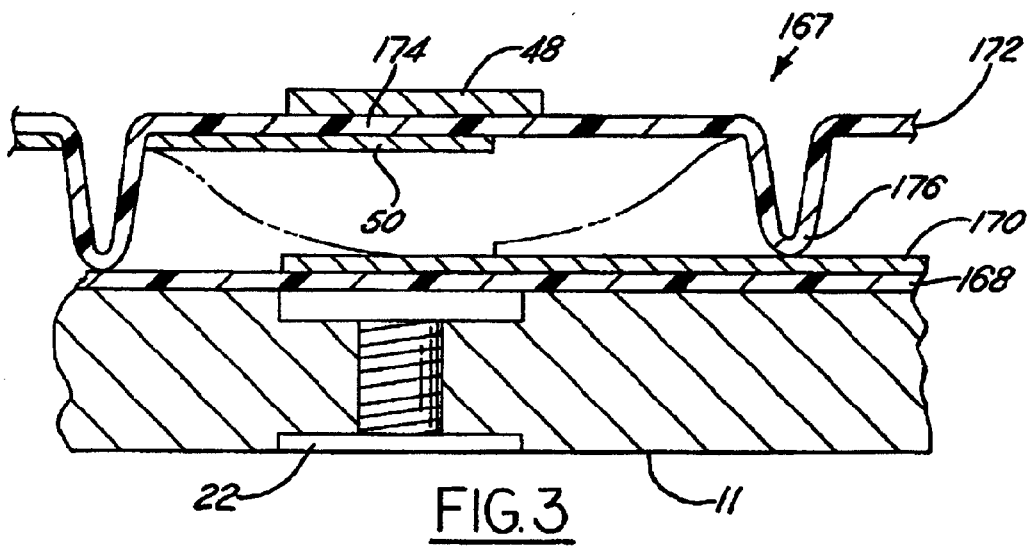
FIG. 3 is a height-exaggerated sectional view of an alternate embodiment of the present invention wherein the first substrate has deformed dimples to support the second substrate over the first substrate.

Referring to FIG. 3, a relay 167 is provided. Relay 167 has a first coil support structure 11 mounting a coil 22. The first substrate 168 has a conductive membrane 170. The relay 167 has a second substrate 172. The second substrate 172 has a contact portion 174. Connected adjacent to contact portion 174 is a ferritic member 48. The second substrate 172 has a series of support dimples 176 formed by heat staking or other suitable forming processes. The support dimples 176 hold the second substrate 172 contact portion 174 in its second position spaced away from the first substrate 168. Upon activation of the coil 22, the first contact portion 174 is brought down to a phantom position, placing the second conductive membrane 50 in contact with the first conductive membrane 170. Deactivation of the coil 22 will cause the dimples 176 to raise the contact portion 174 back to the second position.

Figure 4:
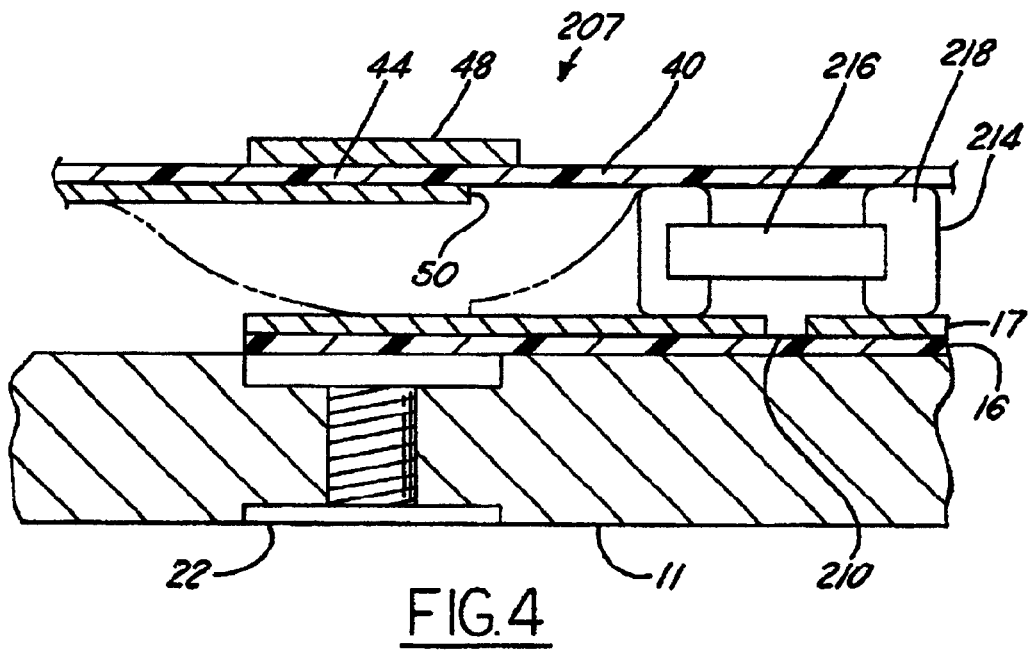
FIG. 4 is a height-exaggerated view of an alternate embodiment of the present invention wherein the second substrate is supported above the first substrate by a cap termination surface mounted device.

Referring to FIG. 4, a relay 207 is provided. Relay 207 has a coil support structure 11 with an embedded coil 22. A first substrate 16 has connected thereto a first conductive membrane 17. The conductive membrane 17 has a gap 210. Bridging the gap 210 is a surface mounted device 214.

The surface mounted device 214 is provided by a thick film resistor 216. The surface mounted device, as shown, is a flat chip resistor. Other suitable surface mounted devices, such as capacitors, inductors, fuses, and shunts can be utilized. The surface mounted device 214 has an aluminum substrate with a film resistant element extending on top. A typical film resistant material is ruthenium oxide $RUO_2$. The resistant element additionally has protective coating on its side (not shown). The surface mounted device 214 has two outer post terminals or end caps 218. The surface mounted device 214 supports a second substrate 40 such that its contact portion 44 is held in the first position spaced away from the first substrate 16.

Activation of the coil 22 will cause a magnetic force to pull down a ferritic member 48, causing a second conductive membrane 50 to make contact with the first conductive membrane 17.

Figure 5:
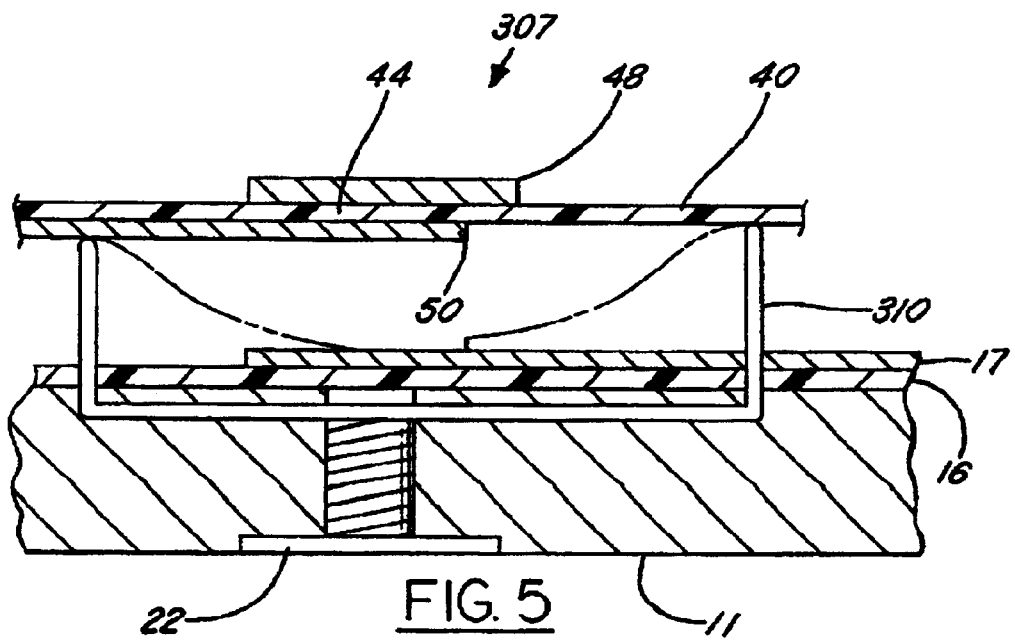
FIG. 5 is a height-exaggerated sectional view of an alternate embodiment of the present invention wherein the coil has spindle towers to support the second substrate above the first substrate.

Referring to FIG. 5, a relay 307 is provided. The relay 307 has a first substrate 16 substantially similar as previously described along with a conductive membrane 17. A second substrate 40 is provided having a second conductive membrane 50 and a contact portion 44 along with a ferritic member 48.

The coil 22 along its upper end has a set of spindle towers 310 that support the second substrate 40 in its first position. The spindle towers 310 will typically be fabricated from a non-conductive, non-magnetic material. Activation of the coil 22 in a manner to that previously described will cause the ferritic member 48 and contact portion 44 to assume their second position generally adjacent to the first substrate 16 to allow the conductive membranes 17, 50 to make electrical contact. Deactivation of the coil 22 will allow the flexural force of the second substrate to restore itself to its prior first position on top of the spindle towers 310.

Figure 6:
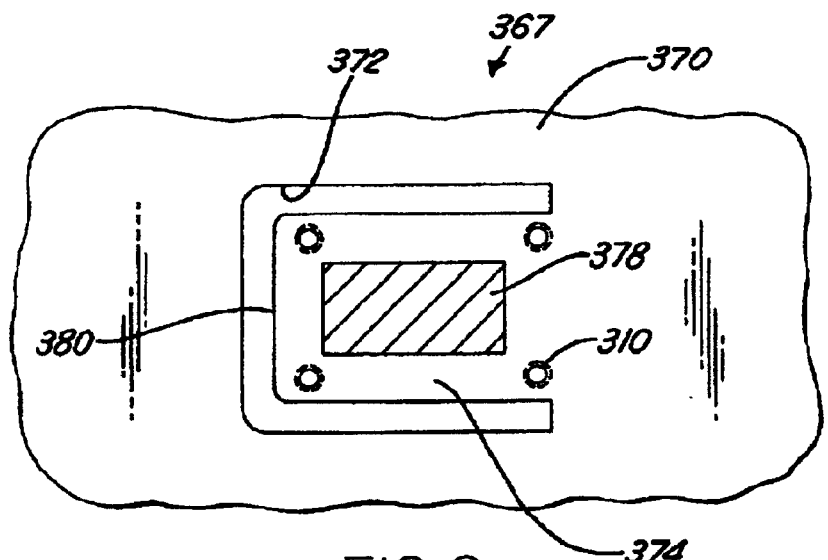
FIG. 6 is a top elevational view of an alternate embodiment of the present invention wherein the second substrate has a U-shaped cutout to form a cantileverly supported portion.

Referring to FIG. 6, a relay 367 is provided. Relay 367 has a first substrate, first conductive membrane and coil substantially similar to the relay 7 of FIG. 1 or the relay 307 in FIG. 5. The relay 367 has a second substrate 370 having a U-shaped cutout 372 forming a cantileverly supported contact portion 374. The contact portion 374 on its underside has a conductive membrane. On its top the contact portion 374 has a ferritic member 378. The contact portion 374 is cantileverly supported by the stiffness of the second membrane 370 or alternatively by spindle towers 310. Activation of the coil 22 causes the extreme end 380 of the contact portion 374 to move downwards to cause an underlying membrane conductor to make contact with the membrane conductor of the first substrate.

Figure 7:
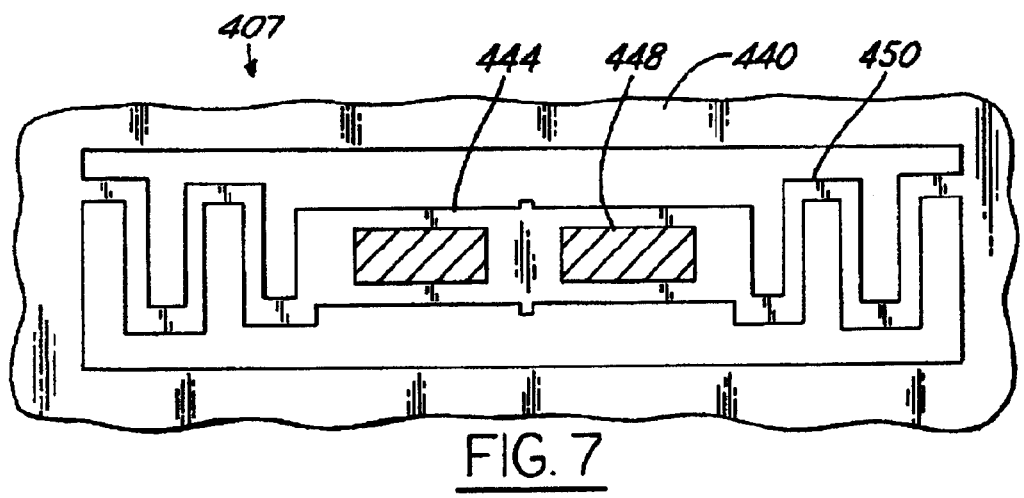
FIG. 7 is a top elevational view of an alternate embodiment of the present invention wherein the second substrate has a serpentine cutout to provide serpentine legs.

FIG. 7 brings forth a relay 407 substantially similar to relay 367 of FIG. 6. The first substrate conductive membrane and coil of the relay 407 will be essentially similar to that as described in regard to FIG. 1. Relay 407 has a second substrate 440 having a contact portion 444. Contact portion 444 has connected thereto two ferritic members 448. The contact portion 444 is provided by a serpentine cutout providing serpentine legs 450. Substrate 440 can be thicker or more rigid and still have a high sensitivity because of the serpentine form of the contact portion 444. Activation of a coil causes the legs 450 to elongate to allow the contact portion 444 to be lowered to a position placing it adjacent to the underlying first conductive membrane. The second conductive membrane will generally extend underneath the contact portion 444 and legs 450.

Figure 8:
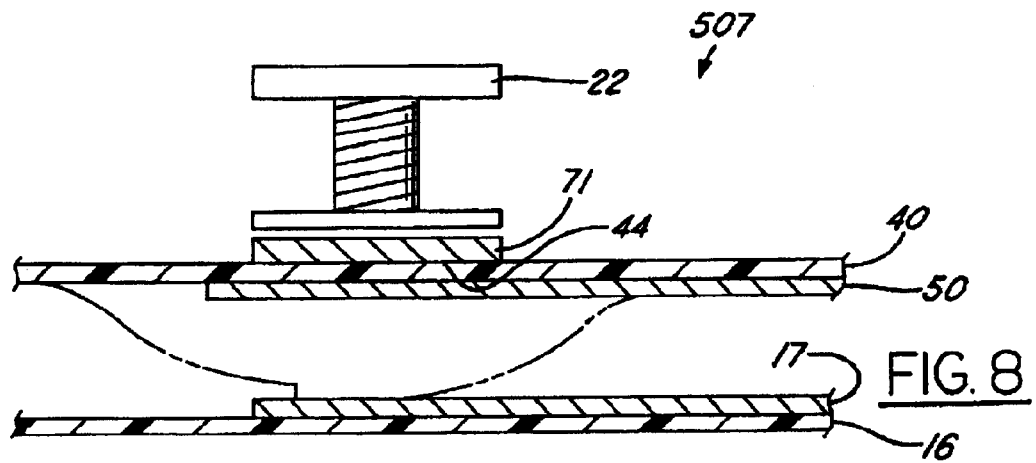
FIG. 8 is a height-exaggerated sectional view similar to that of FIG. 1, wherein the coil is activated to repulse a ferritic member to make contact between the first and second substrates.

Referring to FIG. 8, relay arrangement 507 has a first rigid substrate 16 with a conductive membrane 17 and a second flexible substrate 40 with a conductive membrane 50, as previously described. The coil 22 is positioned adjacent the second substrate 40. A permanent magnet 71 is provided adjacent the second substrate contact portion 44. Activation of the coil 22 provides a magnetic field which forces the permanent magnet 71 down to cause an electrical contact between the first conductive membranes 17, 50.

While preferred embodiments of the present invention have been disclosed, it is to be understood that they have been disclosed by way of example only and that various modifications can be made without departing from the spirit and scope of the invention as it is encompassed by the following claims.

What is claimed is:

1. An arrangement of a flex circuit relay comprising:
    a first substrate;
    a first conductive membrane connected on said first substrate;
    a second flexible substrate having a contact portion, said second substrate contact portion in a first position being spaced away from said first substrate, and said second substrate contact portion in a second position being spaced adjacent to said first substrate;
    a second conductive membrane connected on said second substrate;
    a ferritic member connected on said second substrate adjacent said contact portion; and
    a coil having wire windings wrapped around a core for providing a magnetic field to cause said second substrate contact portion to move between said second substrate contact portion first position and said second substrate contact portion second position against a flexural force of said second substrate.

2. An arrangement as described in claim 1, wherein said first substrate is generally rigid.

3. An arrangement as described in claim 1, wherein said ferritic member is a permanent magnet.

4. An arrangement as described in claim 1, further including a coil supporting structure for positioning said coil adjacent said first substrate.

5. An arrangement as described in claim 1, further including a coil supporting structure for positioning said coil adjacent said second substrate.

6. An arrangement as described in claim 5, wherein said coil supporting structure supports a plurality of coils in an array for a plurality of flex circuit relays.

7. An arrangement as described in claim 6, wherein said coils are preterminated to an interface to make electrical contact with other relay coils.

8. An arrangement as described in claim 3, wherein said first substrate is flexible, having a contact portion and an adjacent second permanent magnet ferritic member and wherein said coil causes said first substrate contact portion to move between a first position spaced away from said second substrate and a second position adjacent to said second substrate.

9. An arrangement as described in claim 8, wherein the polarities of said permanent magnets on said first and second substrates are such that opposite polarities are adjacent to one another.

10. An arrangement as described in claim 8, wherein the polarities of said permanent magnets on said first and second substrates are such that the same polarities are adjacent to one another.

11. An arrangement as described in claim 1, wherein said second substrate is dimpled to position said second substrate contact portion in said first position.

12. An arrangement as described in claim 1, wherein said second substrate is held in said first position by a surface mounted device.

13. An arrangement as described in claim 1, wherein said coil has a spindle tower to place said second substrate in said first position.

14. An arrangement as described in claim 1, wherein said second substrate contact portion is formed by a cantilevered U-shaped cutout of said second substrate.

15. An arrangement as described in claim 1, wherein said second substrate contact portion is formed by a cutout of said second substrate.

16. An arrangement as described in claim 15, wherein said second substrate contact portion cutout is formed by a serpentine cutout.

17. An arrangement as described in claim 15, having a plurality of ferritic members connected on said second substrate.

18. An arrangement as described in claim 1, having a plurality of ferritic members connected on said second substrate.

* * * * *